United States Patent
Wang et al.

(10) Patent No.: US 12,206,217 B2
(45) Date of Patent: Jan. 21, 2025

(54) CONTROL SYSTEM AND METHOD FOR LASER PUMP OF DOPED FIBER AMPLIFIER

(71) Applicant: II-IV Delaware, Inc., Wilmington, DE (US)

(72) Inventors: Zhoujian Wang, Fuzhou (CN); Xingyu Weng, Fuzhou (CN); Qiaowen Chen, Fuzhou (CN)

(73) Assignee: II-VI DELAWARE, INC., Wilmington, DE (US)

( * ) Notice: Subject to any disclaimer, the term of this patent is extended or adjusted under 35 U.S.C. 154(b) by 18 days.

(21) Appl. No.: 18/214,223

(22) Filed: Jun. 26, 2023

(65) Prior Publication Data

US 2023/0335967 A1    Oct. 19, 2023

Related U.S. Application Data

(63) Continuation of application No. 17/132,629, filed on Dec. 23, 2020, now Pat. No. 11,728,612.

(30) Foreign Application Priority Data

Dec. 26, 2019    (CN) .......................... 201911369224.9

(51) Int. Cl.
*H01S 3/067*    (2006.01)
*H01S 3/04*    (2006.01)
(Continued)

(52) U.S. Cl.
CPC ........ *H01S 3/06754* (2013.01); *H01S 3/0405* (2013.01); *H01S 3/0912* (2013.01); *H01S 3/10069* (2013.01); *H01S 3/1608* (2013.01); *H01S 3/094003* (2013.01); *H01S 5/042* (2013.01)

(58) Field of Classification Search
None
See application file for complete search history.

(56) References Cited

U.S. PATENT DOCUMENTS 5,019,769 A    5/1991 Levinson
5,604,757 A    2/1997 Liang et al.
(Continued)

FOREIGN PATENT DOCUMENTS

CN    107516807 A    12/2017
CN    109687278 A    4/2019

OTHER PUBLICATIONS

LV, et al., "A Fast Optical Wavelength-Tunable Transmitter With a Linear Thermoelectric Cooler Driver", IEEE Electron Device Letters, vol. 30, No. 4, Apr. 2009, pp. 353-355. (Year: 2009).

*Primary Examiner* — Eric L Bolda
(74) *Attorney, Agent, or Firm* — Blank Rome LLP

(57) ABSTRACT

A control system includes a field-programmable gate array (FPGA), a digital-to-analog conversion (DAC) circuit, an external TEC driver, and a pump chip. The field-programmable gate array (FPGA) includes a pump driver and a thermoelectric-cooler (TEC) controller. The digital-to-analog conversion (DAC) circuit is coupled to the FPGA. The external TEC driver is external to the FPGA and coupled to the FPGA. The pump chip includes a pump and a TEC and is coupled to the DAC circuit and the external TEC driver.

19 Claims, 5 Drawing Sheets

(51) Int. Cl.
   *H01S 3/091*   (2006.01)
   *H01S 3/10*    (2006.01)
   *H01S 3/16*    (2006.01)
   H01S 3/094    (2006.01)
   H01S 5/042    (2006.01)

(56) References Cited

U.S. PATENT DOCUMENTS

| | | | |
|---|---|---|---|
| 5,936,987 A * | 8/1999 | Ohishi | H01S 3/109 372/38.03 |
| 2009/0141757 A1 | 6/2009 | Parker et al. | |
| 2016/0204569 A1 | 7/2016 | Kuzukami | |
| 2017/0237220 A1 | 8/2017 | McGanty et al. | |

* cited by examiner

500

```
┌─────────────────────────────────────────────┐
│  Pause the pump driver in the primary FPGA  │──── S501
└─────────────────────────────────────────────┘
                      │
┌─────────────────────────────────────────────┐
│ Stop the TEC controller in the primary FPGA,│
│   activate the TEC controller in the backup │──── S502
│    FPGA to maintain the temperature of the  │
│                    pump                     │
└─────────────────────────────────────────────┘
                      │
┌─────────────────────────────────────────────┐
│  Copy pump driver values of the primary FPGA│
│    to the pump driver in the backup FPGA,   │──── S503
│   and activate the pump driver in the backup│
│                    FPGA                     │
└─────────────────────────────────────────────┘
                      │
┌─────────────────────────────────────────────┐
│ Store field content of the primary FPGA to  │──── S504
│                  a memory                   │
└─────────────────────────────────────────────┘
                      │
┌─────────────────────────────────────────────┐
│ Peform reconfiguration on the primary FPGA  │──── S505
│              using the FPP driver           │
└─────────────────────────────────────────────┘
                      │
┌─────────────────────────────────────────────┐
│  Restore the field content of the primary   │──── S506
│                    FPGA                     │
└─────────────────────────────────────────────┘
                      │
┌─────────────────────────────────────────────┐
│ Return the control on the TEC to the primary│──── S507
│                    FPGA                     │
└─────────────────────────────────────────────┘
                      │
┌─────────────────────────────────────────────┐
│ Activate the primary FPGA, and active the   │──── S507
│   update of pump driver values for the pump │
└─────────────────────────────────────────────┘
```

FIG. 5

CONTROL SYSTEM AND METHOD FOR LASER PUMP OF DOPED FIBER AMPLIFIER

CROSS-REFERENCE TO RELATED APPLICATIONS

This application is a continuation of U.S. patent application Ser. No. 17/132,629, filed Dec. 23, 2020, which claims priority to Chinese Patent Application No. 201911369224.9 filed on Dec. 26, 2019, the content of each of which are relied upon and incorporated herein by reference in their entirety.

TECHNICAL FIELD

The disclosure relates generally to the field of control technology for a doped fiber amplifier, such as an erbium doped fiber amplifier (EDFA), in particular to a control structure and control method for uninterrupted light output of such a doped fiber amplifier.

BACKGROUND

In an erbium-doped fiber amplifier (EDFA) control system, when the system is running or during maintenance, it is crucial to maintain a stable output of the light-drive pump. Many existing EDFA control systems use modes in which a field-programmable gate array (FPGA) directly drives the pump. However, for structures that use direct-drive modes for the EDFA pump, output light may be interrupted when the FPGA is being upgraded because the FPGA may not maintain the output. Therefore, the operation may be influenced.

As an example, FIG. 1 illustrates a schematic diagram of an existing EDFA control system according to the prior art. The EDFA control system of FIG. 1 includes a FPGA 110, a digital-to-analog conversion (DAC) circuit 120, and a pump chip 140. The FPGA 110 includes a pump driver 111, a TEC controller 115, and a TEC driver 116 in the FPGA 110. The pump chip 140 includes a pump 141 and a thermoelectric-cooler (TEC) 142. During the updating of the FPGA 110, the FPGA 110 may not maintain the output. Accordingly, output light may be interrupted, and the tasks or operations may be influenced.

The subject matter of the present disclosure is directed to overcoming, or at least reducing the effects of, one or more of the problems set forth above.

SUMMARY

The present disclosure provides control systems and control methods for an uninterrupted light output of a doped fiber amplifier, such as an erbium doped fiber amplifier (EDFA).

In some examples, a control system includes a field-programmable gate array (FPGA), a digital-to-analog conversion (DAC) circuit, an external TEC driver, and a pump chip. The field-programmable gate array (FPGA) includes a pump driver and a thermoelectric-cooler (TEC) controller. The digital-to-analog conversion (DAC) circuit is coupled to the FPGA. The external TEC driver is external to the FPGA and coupled to the FPGA. The pump chip includes a pump and a TEC and is coupled to the DAC circuit and the external TEC driver.

In certain examples, A control system, includes a primary field-programmable gate array (FPGA), a backup FPGA, a digital-to-analog conversion (DAC) circuit, and a pump chip. The FPGA includes a pump driver, a thermoelectric-cooler (TEC) controller, and a TEC driver. The backup FPGA includes a pump driver, a TEC controller, and a TEC driver. The digital-to-analog conversion (DAC) circuit is coupled to the primary and backup FPGAs. The pump chip includes a pump and a TEC and is coupled to the DAC circuit and the primary and backup FPGAs.

BRIEF DESCRIPTION OF THE DRAWINGS

The present disclosure will be further described in detail below with reference to embodiments and accompanying drawings in which:

FIG. 5 illustrates a flow chart of an example control method 500 for an example EDFA control system including multiple FPGAs for uninterrupted light output according to disclosed embodiments.

DETAILED DESCRIPTION

Figure 1:
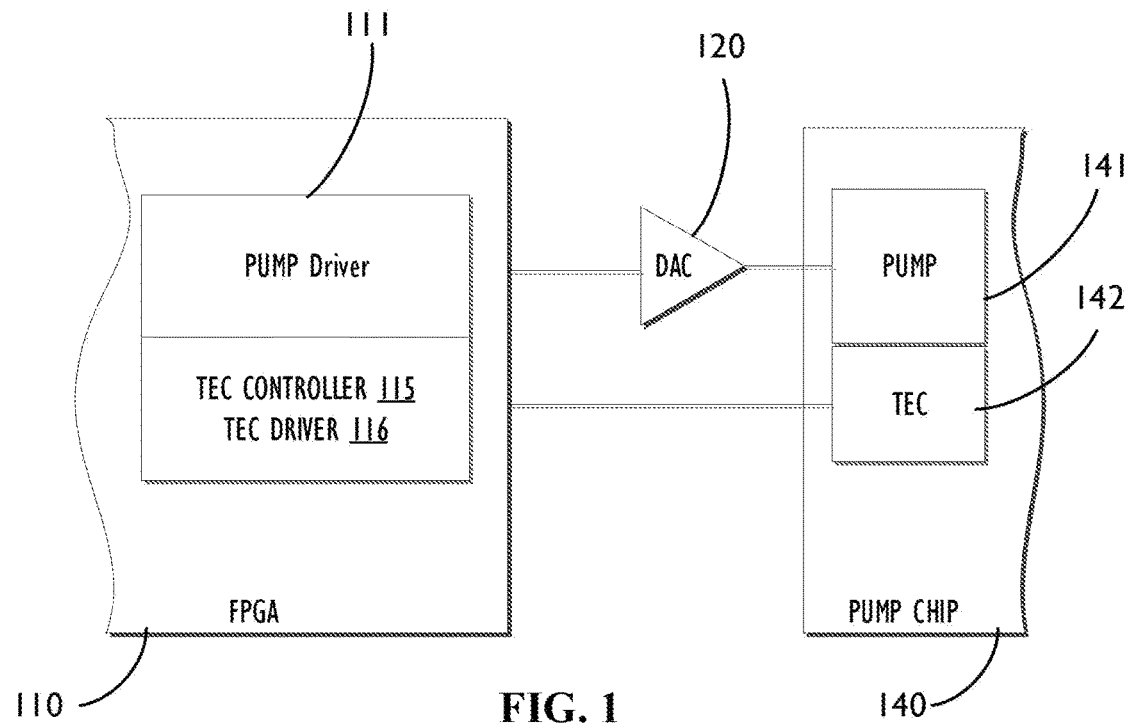
FIG. 1 illustrates a schematic diagram of an existing control system according to the prior art for an EDFA.
Figure 2A:
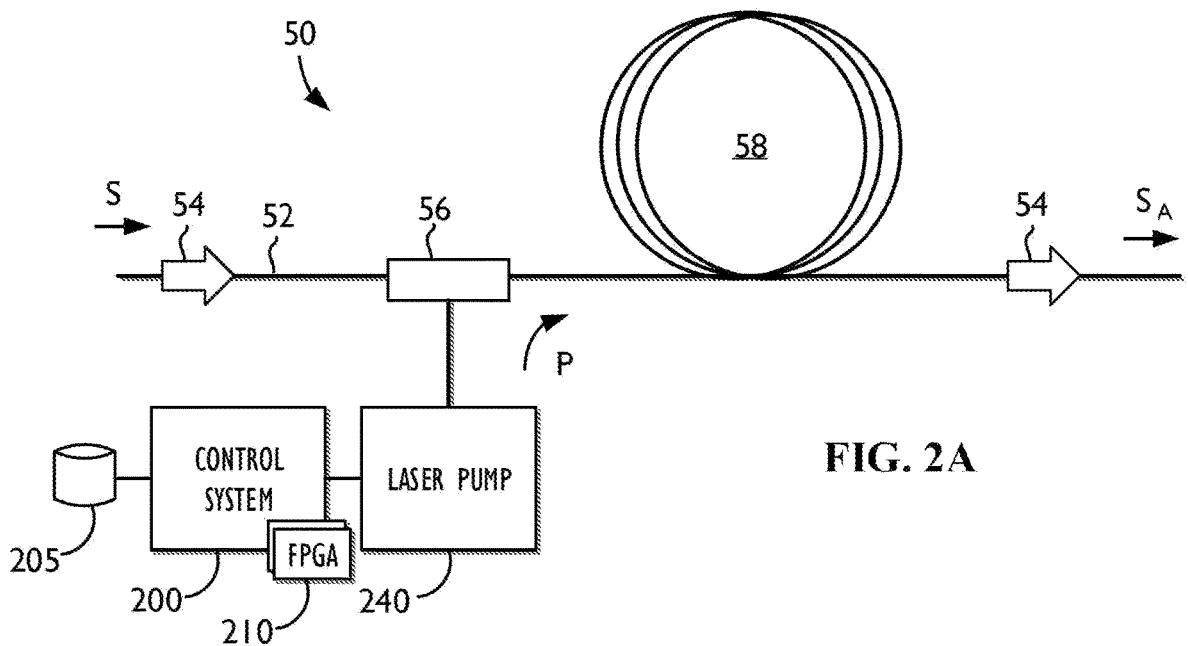
FIG. 2A illustrate portion of a doped fiber amplifier according to the present disclosure.

FIG. 2A schematically illustrate portion of one type of doped fiber amplifier 50 according to the present disclosure. In the doped fiber amplifier 50, an optical signal S is transmitted along a fiber 52 and is passed through a doped fiber 58, which is doped with a rare-earth element, such as erbium or the like. At the same time, ions in the doped fiber 58 are energized using pump light P, which is provided by a laser pump laser 240 at a different wavelength.

For example, the optical signal S transmitted along the fiber 52 passes an isolator 54, which reduces back reflection. The laser pump 240 injects pump light P into the fiber 52 using a beam combiner 56. The pump light P energizes ions in the doped fiber 58. Meanwhile, in the doped fiber 58, photons of the optical signal S interact with the energized ions, causing the ions to give up some of their energy in the form of photons at the same wavelength as the photons of the optical signal S, with the ions returning to a lower energy state. The optical signal S is thereby amplified as it passes through the doped fiber 58 to produce an amplified signal SA. As an Erbium doped fiber amplifier (EDFA), the optical signal S to be amplified can be in the 1550-nm wavelength range, and the wavelength of the pump light P from the pump laser 240 can be 980 and/or 1480 nm. As shown, the laser pump 240 can be controlled by a control system 200, which includes one or more field programmable arrays (FPGAs) 210 and can include a memory 205. The control system 200 is directed to a Non-Traffic-Affection (NTA) hardware control system or structure, which may include a control system/structure based on a single FPGA 210; or a control system/structure based on multiple FPGAs 210, such as dual FPGAs. When upgrading certain components of the NTA hardware control system 200, the tasks or operations may not be affected or interrupted, or interruption to the tasks or operations may be reduced. The control system 200 may be chosen according to various application scenarios.

In one embodiment, the control system 200 has a single FPGA 210 to achieve an uninterrupted light output of the laser pump 240 for the doped fiber amplifier 50 (e.g., EDFA). In the NTA control system 200 having the single FPGA 210, the driving part of thermoelectric-cooler (TEC) control-and-drive components originally located inside the FPGA 210 may be moved to the outside of the FPGA 210, and the control system 200 can use a thermoelectric-cooler (TEC) controller, such as a commercially available TEC controller, to maintain a temperature of the drive pump in a configured or preset range during the FPGA upgrade. The FPGA 210 as disclosed herein may be, for example, a FPGA circuit.

Figure 2B:
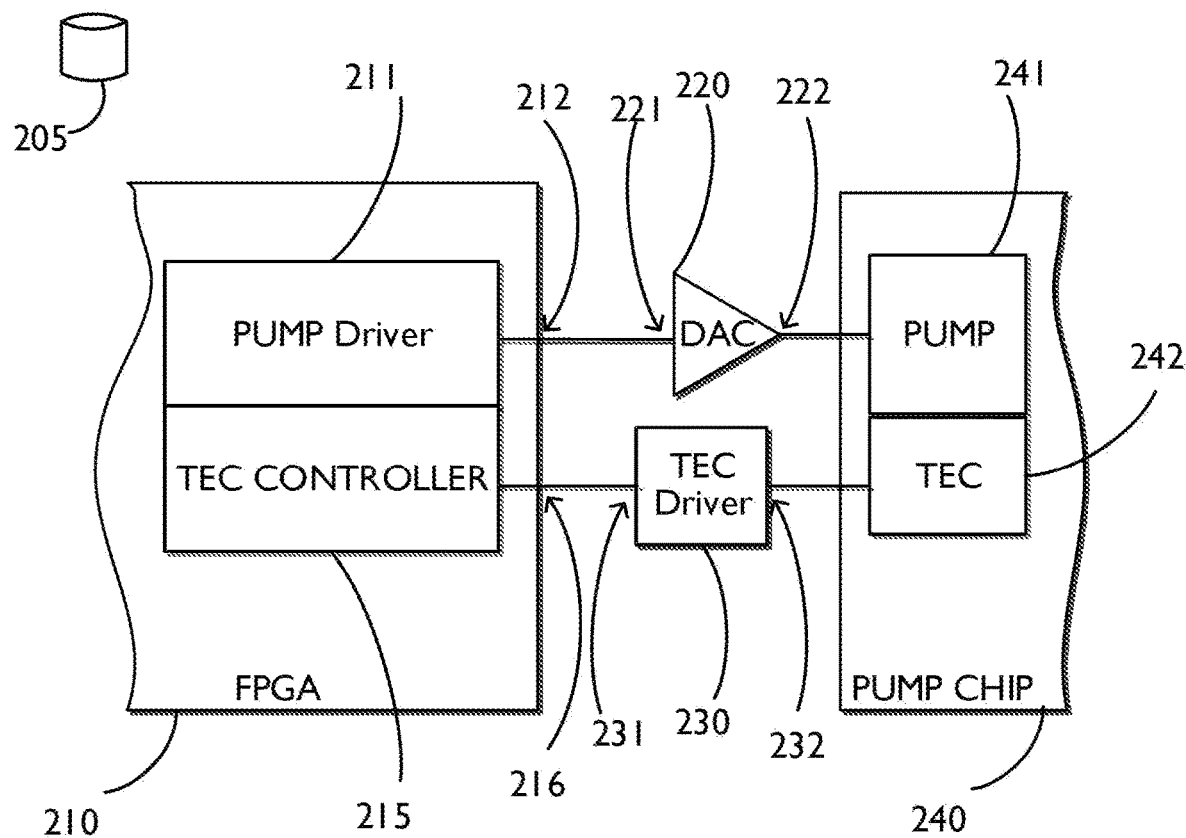
FIG. 2B illustrates a schematic diagram of an example control system for a doped fiber amplifier, such as an EDFA, including a FPGA for uninterrupted light output according to disclosed embodiments.

Turning to further details, FIG. 2B illustrates a schematic diagram of an example control system 200 of the present disclosure for a doped fiber amplifier, such as described in FIG. 2A. The control system 200 includes a single FPGA 210 for uninterrupted light output according to disclosed embodiments. In addition to the single FPGA 210, the control system 200 includes a digital-to-analog conversion (DAC) circuit 220, an external TEC driver (e.g., an external TEC drive 230 that is external with respect to the FPGA 210). The FPGA 210 includes a pump driver 211 and a TEC controller 215 integrated in the FPGA 210. The laser pump being controlled by the control system 200 has a pump chip 240 that includes a pump 241 and a thermoelectric-cooler (TEC) 242 integrated in the pump chip 240.

An output terminal 212 of pump driver 211 is coupled to an input terminal 221 of the DAC circuit 220, and an output terminal 222 of the DAC circuit 220 is coupled to the pump 241 that is integrated in the pump chip 240. An output terminal 216 of the TEC controller 215 is coupled to the external TEC driver 230 that is external to the FPGA 210 or outside the FPGA 210. For example, the output terminal 216 of the TEC controller 215 is coupled to an input terminal 231 of the external TEC driver 230. An output terminal 232 of the external TEC driver 230 is coupled to the TEC 242 integrated in the pump chip 240.

As noted above, the control system 200 may further include a memory 205, such as a memory inside or outside the FPGA 210. In some examples, the memory 205 may include a non-volatile or volatile memory external to the FPGA 210; and/or a non-volatile memory in the FPGA 210; and/or any other suitable memory device for storing data of the FPGA 210 during upgrading the FPGA 210, such as configuration data of the FPGA 210.

As will be appreciated, the arrangement depicted in FIG. 2 is merely schematic. The pump chip 240 can have one or more pumps 241 and can have one or more TEC devices 242 depending on the implementation. The control system 200 can be configured to operate the one or more pumps 241 and TEC devices 242 as needed.

In some examples, the pump driver 211 is configured to drive the pump 241 to produce optical output for a doped fiber amplifier; the TEC controller 215 is configured to control the TEC 242 to adjust a temperature of at least a portion of the pump chip 240; and the external TEC driver 230 is configured to control the TEC 242 in place of the TEC controller 215.

In some examples, the FPGA 210 has an operation mode and an update mode; the pump driver 211 is configured in the operation mode to drive the pump 241 and to be at least paused in the update mode; and the TEC controller 215 is configured in the operation mode to control the TEC 242 and be at least paused in the update mode. The DAC circuit 220 is configured in the operation mode to convert the drive from the pump driver 211 to the pump 241 and is configured in the update mode to maintain the drive to the pump 241 for the paused pump driver 211. In certain examples, the external TEC driver 230 is configured in the operation mode to drive the TEC 242 based on the control of the TEC controller 215, and is configured in the update mode to control the TEC 242 for the paused TEC controller 215.

Figure 4:
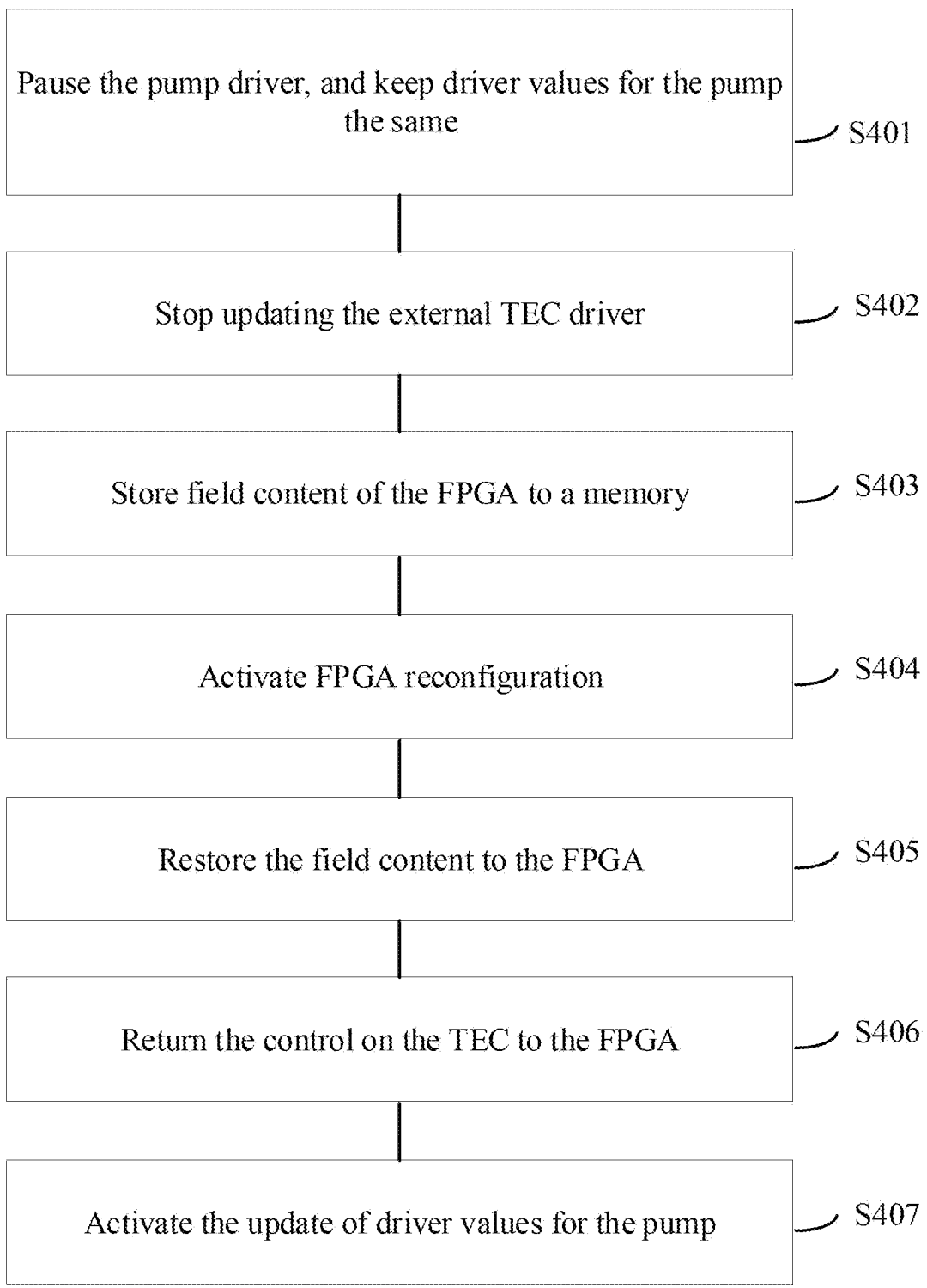
FIG. 4 illustrates a flow chart of an example control method 400 for an example EDFA control system including a FPGA for uninterrupted light output according to disclosed embodiments.

FIG. 4 illustrates a flow chart of an example control method 400 for an example EDFA control system, such as shown in FIG. 2, including a FPGA for uninterrupted light output according to disclosed embodiments. Via the control method 400, light output may be uninterrupted, e.g., during the upgrade on a FPGA. The control method 400 may be performed by a control system/structure consistent with the present disclosure, such as the above described control system 200 in FIG. 2. Accordingly, descriptions for the method 400 are made below with reference to FIGS. 2 and 4.

At S401 in FIG. 4, the pump driver 211 is paused, and driver values of the pump 241 are kept the same. For example, the pump driver 211 in the FPGA 210 is paused, and driver values are kept the same, e.g., in the DAC 220.

At S402, the FGPA 210 stops updating the external TEC driver 230. For example, the FGPA 210 may stop updating, e.g., values or data, from the FGPA 210 to the external TEC driver 230; and the external TEC driver 230 may take over or take the control on the TEC 242, so as to maintain the temperature of the drive pump 241 in a configured or preset range during the upgrade/update of the FPGA 210.

At S403, field content (e.g., field data) of the FPGA 210 are stored to a memory 205, such as an internal non-volatile memory, an external non-volatile memory with respect to the FPGA 210, and/or an external volatile memory with respect to the FPGA 210. The external non-volatile memory (as an example of memory 205) may include, for example, an external flash-memory device of the control system 200. For example, the field content of the FPGA 210 may be saved to a non-volatile memory 205 that is external to the FPGA 210 and included in the control system 200. The field content of an FPGA 210 may include, for example, present pump control values and drive values, TEC control values, and/or other values that need to be maintained or stored, such as variable-optical-attenuator (VOA) settings or configuration values.

At S404, the FPGA reconfiguration is activated or performed according to the update. During the FPGA reconfiguration, a pin, alternatively at least one pin, or alternatively all of the IO pins (PIN) (depending on the configuration) for FPGA 210 are kept at weak pull-up, e.g., a weak pull-up status, and no update or refreshing is performed on the driver value of the pump 241, e.g., in the DAC 220. In some examples, the FPGA reconfiguration may be activated or performed by using another component, e.g., a microcontroller unit (MCU), of control system 200.

At S405, the field content is restored to the FPGA 210. For example, the field content or field data stored in the memory 205 is restored to the FPGA 210.

At S406, the control on the TEC 242 is returned to the FPGA 210. For example, the control on the TEC 242 is returned from the external TEC driver 230 to the FPGA 210; and the FPGA 210 may control the TEC 242 via the external TEC driver 230.

At S407, update of driver values for the pump 241 is activated or performed. For example, the pump driver 211 in the FPGA 210 may resume operation, and the driver values for the pump 241 in the DAC 220 may be updated by the pump driver 211.

As already noted, the non-volatile memory 205 may include, for example, an external non-volatile memory, such as an external flash memory device, that is external to the FPGA 210, or an internal non-volatile memory in the FPGA 210. The field content of the FPGA 210 may include, for example, present pump control values, pump drive values (i.e., pump driver values) such at voltage and current values, TEC control values, variable-optical-attenuator (VOA) settings or configuration values.

In contrast to the arrangement in FIG. 2, the present disclosure further provides another control system or structure having multiple FPGAs, such as dual FPGAs, to achieve an uninterrupted light output of a doped fiber amplifier (e.g., EDFA). The control system may include, for example, one or more primary FPGAs (i.e., one or more primary driving FPGAs) and one or more backup FPGAs (i.e., one or more backup driving FPGAs). The control system may use a control FPGA as a backup FPGA. During the reconfiguration of the primary FPGA, the backup FPGA may take over or take control on the pump and TEC tasks. Meanwhile, the backup FPGA may acts as a fast configuration controller, e.g., a fast-passive-parallel (FPP) configuration controller, so as to achieve fast FPGA reconfiguration.

Figure 3:
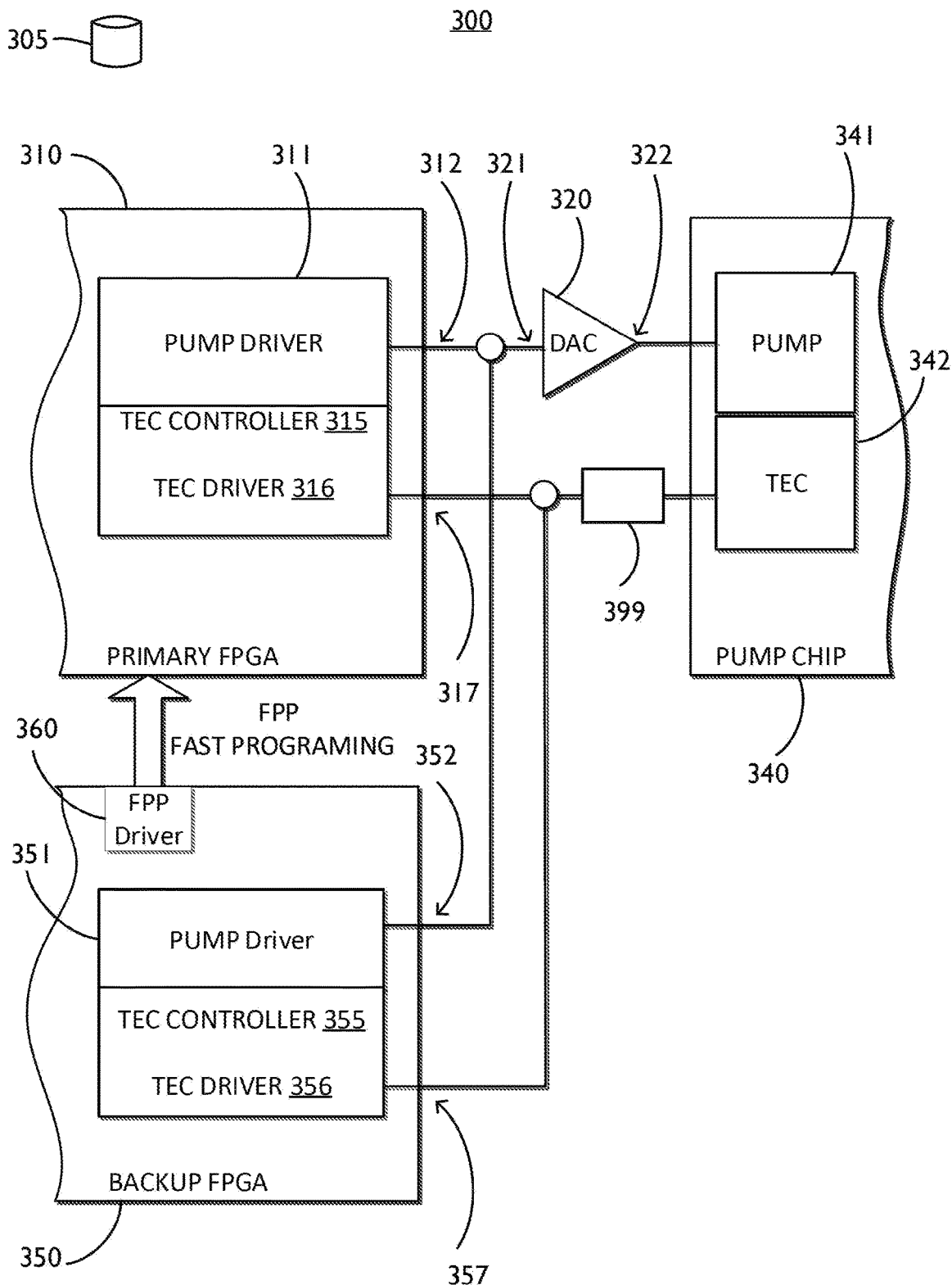
FIG. 3 illustrates a schematic diagram of another example control system for a doped fiber amplifier, such as an EDFA, including multiple FPGAs for uninterrupted light output according to disclosed embodiments.

For example, FIG. 3 illustrates a schematic diagram of another example EDFA control system 300 including multiple FPGAs 310, 350 for uninterrupted light output according to disclosed embodiments. The control system 300 includes a primary driving FPGA 310 (e.g., a master FPGA), a backup driving FPGAs 350 (e.g., a slave FPGAs), a DAC circuit 320, an external TEC driving circuit or an external conversion circuit 399, and a pump chip 340. The external conversion circuit 399 is external to the primary and backup driving FPGAs (310, 350). For example, the circuit 399 can include an external TEC driver or an external conversion circuit that converts signals from the TEC driver 316/356 to analog signals.

The primary FPGA 310 includes a pump driver 311, a TEC controller 315, and a TEC driver 316 integrated in the primary FPGA 310, and the TEC controller 315 is internally coupled to (e.g., connected to) the TEC driver 316 in the primary FPGA 310. Similarly, the backup FPGA 350 includes a pump driver 351, a TEC controller 355, and a TEC driver 356 integrated in the backup FPGA 350, and the TEC controller 355 is internally coupled to (e.g., connected to) the TEC driver 356 in the backup FPGA 350. For its part, the laser pump being controlled by the control system 300 has a pump chip 340 that includes a pump 341 and a thermoelectric-cooler (TEC) 342 integrated in the pump chip 340.

An output terminal 312 of the pump driver 311 of the primary FPGA 310 is coupled to an input terminal 321 of the DAC circuit 320, and an output terminal 352 of the pump driver 351 of the backup FPGA 350 is coupled to the input terminal 321 of the DAC circuit 320. An output terminal 322 of the DAC circuit 320 is coupled to the PUMP 341 integrated in the PUMP chip 340.

An output terminal 317 of the TEC driver 316 in the primary FPGA 310 is coupled to the TEC 342 integrated in the pump chip 340; and an output terminal 357 of the TEC driver 356 of the backup FPGA 350 is coupled to the TEC 342 integrated in the pump chip 340. In some examples, the output terminal 317 of the TEC driver 316 in the primary FPGA 310 is coupled to the TEC 342 via the external TEC driving circuit or external conversion circuit 399; and the output terminal 357 of the TEC driver 356 of the backup FPGA 350 is coupled to the TEC 342 via the external TEC driving circuit or external conversion circuit 399; and the external TEC driving circuit/external conversion circuit 399 coverts digital signals from the output terminal 317 of the TEC driver 316 or from the output terminal 357 of the TEC driver 356 to analog signals and provides the analog signals to the TEC 342.

In the examples of FIG. 3, the backup FPGA 350 further includes a fast-passive-parallel (FPP) driver 360 integrated in the backup FPGA 350; and the backup FPGA 350 may be coupled to the primary FPGA 310 and may perform fast FPGA reconfiguration on the primary FPGA 310 via the FPP driver 360. In some examples, the backup FPGA 350 may include another driver for performing FPGA reconfiguration, such as a passive-serial-configuration driver, and the backup FPGA 350 may be coupled to the primary FPGA 310 and may perform FPGA reconfiguration on the primary FPGA 310 via the passive-serial-configuration driver. In other examples, the FPGA reconfiguration on the primary FPGA 310 may be performed by using some other component, e.g., a microcontroller unit (MCU), of the control system 300.

The control system 300 may further include a memory 305, e.g., for storing or saving field content of the primary FPGA 310, e.g., configuration data of the primary FPGA 310. The memory 305 may include, for example, an external synchronous dynamic random-access memory (SDRAM) that is external to, e.g., the primary FPGA 310; and/or an internal random-access memory (RAM) of the backup FPGA 350; and/or any other suitable memory device.

Again as will be appreciated, the arrangement depicted in FIG. 3 is merely schematic. The pump chip 340 can have one or more pumps 341 and can have one or more TEC devices 342 depending on the implementation. The control system 300 can be configured to operate the one or more pumps 341 and TEC devices 342 as needed.

In some examples, each of the pump drivers 311, 351 is configured to drive the pump 341 to produce optical output for a doped fiber amplifier, each of the TEC controllers 315, 355 is configured to control the TEC 342 to adjust a temperature of at least a portion of the pump chip 340. In certain examples, the primary FPGA 310 has an operation mode and an update mode; the pump driver 311 of the primary FPGA 310 is configured to drive the pump 341 in the operation mode and to be at least paused in the update mode; and the TEC controller 315 of the primary FPGA 310 is configured to control the TEC 342 in the operation mode and to be at least paused in the update mode. In some examples, the pump driver 351 and the TEC controller 355 of the backup FPGA 350 are activated in the update mode for the pump driver 311 and the TEC controller 315 of the primary FPGA 310.

In some examples, the DAC circuit 320 is configured in the operation mode of the primary FPGA 310 to convert the drive from the pump driver 311 of the primary FPGA 310 to the pump 341; and is configured in the update mode of the primary FPGA 310 to maintain the drive to the pump 341 for the paused pump driver 311 of the primary FPGA 310, at least until the pump driver 351 of the backup FPGA 350 is activated.

FIG. 5 illustrates a flow chart of an example control method 500 for an example EDFA control system, such as shown in FIG. 3, including multiple FPGAs for uninterrupted light output according to disclosed embodiments. Via the control method 500, light output may be uninterrupted, e.g., during upgrade of a primary FPGA. The control method 500 may be performed via a control system/structure consistent with the present disclosure, such as the above described control system 300. Descriptions for the method 500 are made below with reference to FIGS. 3 and 5.

At S501 in FIG. 5, the pump driver 311 in the primary FPGA 310 is paused. For example, the pump driver 311 in the primary FPGA 310 is paused, and driver values of the pump driver 311 are kept the same, e.g., in DAC 320.

At S502, the TEC controller 315 in the primary FPGA 310 is stopped, and the TEC controller 355 in the backup FPGA 350 is activated so the temperature of the pump 341 is maintained. For example, the TEC controller 315 in the primary FPGA 310 is stopped or deactivated, and may be, for example, at a three-state mode or three-state logic for output (e.g., a high impedance state for output), so as to, e.g., not control the TEC status from the TEC controller 315 in the primary FPGA 310, and the TEC controller 355 in the backup FPGA 350 is activated, so as to maintain or control the temperature of the pump 314.

At S503, pump driver values (i.e., pump drive values) of the primary FPGA 340, e.g., pump driver values of pump driver of the primary FPGA, are copied to the pump driver 351 in the backup FPGA 350, and the pump driver 351 in the backup FPGA 350 is activated or started.

At S504, field content (e.g., field data) of the FPGA (e.g., the primary FPGA 310) is stored in a memory 305. For example, the field content of the primary FPGA 310 are stored in a memory 305. The memory 305 may include, for example, an external synchronous dynamic random-access memory (SDRAM) that is external to, e.g., the primary FPGA 310; and/or an internal random-access memory (RAM) of the backup FPGA 350; and/or any other suitable memory device.

At S505, reconfiguration on the primary FPGA 310 is performed by activating FPP configuration using the FPP driver 360. For example, the FPP driver 360 of the backup FPGA 350 may perform FPP configuration on the primary FPGA 310, so as to reconfigure the primary FPGA 310.

At S506, the field content (e.g., field data) of the primary FPGA 350 are restored. For example, the field content of the primary FPGA 310 may be restored from the memory ##to the primary FPGA 310.

At S507, the control on the TEC 342 is returned to the primary FPGA 310. For example, the control on the TEC 342 is returned to the primary FPGA 310.

At S508, the primary FPGA 310 is activated, and the update of driver values for the pump 341 is activated. For example, the primary FPGA 310 is activated, and the primary FPGA 310 updates driver values for the pump 341 to DAC 320.

As noted, the memory 305 may include, for example, an external synchronous dynamic random-access memory (SDRAM) that is external to, e.g., the primary FPGA 310; and/or an internal random-access memory (RAM) of the backup FPGA 350; and/or any other suitable memory device. The field content/data of the FPGA (e.g., the primary or backup FPGA) may include, for example, present pump control values/set points, pump driver voltage/current, TEC control values, and driver values/set-points of optical components, including configuration values for variable-optical-attenuator (VOA), optical photodiode, optical switch, etc.

Via the pump drive and control systems/structures of the present disclosure, the TEC driver or chip located outside the FPGA or outside the primary FPGA may maintain the drive control of the PUMP chip, when the FPGA or the primary FPGA needs to be updated. Accordingly, disturbance on existing tasks or services may be eliminated or reduced, when updating the primary FPGA or the backup FPGA. Thus, not only the scalability and expandability may be maintained, but also maintainability and upgradeability may be improved. In some examples, a control system having dual FPGAs may perform a fast FPP FPGA programming, and the upgrade time may be reduced to the order of approximately 20 ms.

The term "couple" or similar expression means either an indirect or direct connection. If device A is coupled to device B, that connection may be through a direct connection or through an indirect connection via other devices and connections.

The present disclosure may be embodied in other specific forms without departing from its spirit or essential characteristics. The described embodiments are to be considered in all respects only as illustrative and not restrictive.

What is claimed is:

1. A system for a pump chip of a doped fiber amplifier, the system comprising:
a pump driver and a thermoelectric-cooler (TEC) controller, the TEC controller configured to control a TEC device; and
an external TEC driver coupled between the TEC controller and the TEC device, the external TEC driver being configured to control the TEC device in place of the TEC controller.

2. The system of claim 1, wherein the system comprising a pump chip including a pump and the TEC device.

3. The system of claim 2, further comprising a field-programmable gate array (FPGA) including the pump driver, wherein the pump driver is configured to drive the pump to produce optical output for the doped fiber amplifier.

4. The system of claim 2, wherein the TEC controller is configured to control the TEC device to adjust a temperature of at least a portion of the pump chip.

5. The system of claim 3, further comprising a conversion circuit coupling the pump driver of the FPGA to the pump.

6. The system of claim 3, wherein the system is configured to:
pause the pump driver, and keep driver values for the pump the same; and
stop updating the external TEC driver, and cause the external TEC driver to take control of the TEC device.

7. The system of claim 6, wherein the system is further configured to:
store field content of the FPGA to a memory;
activate FPGA reconfiguration;
restore the field content to the FPGA;
return the control on the TEC device to the TEC controller of the FPGA; and
activate an update of driver values for the pump.

8. The system of claim 7, wherein the memory includes a flash-memory device external to the FPGA.

9. The system of claim 7, wherein the field content of the FPGA includes at least one of control values of the pump, drive values of the pump, TEC control values, or variable-optical-attenuator configuration values.

10. The system of claim 3, wherein the FPGA has an operation mode and an update mode, the pump driver being configured in the operation mode to drive the pump and being at least paused in the update mode, the TEC controller being configured in the operation mode to control the TEC device and being at least paused in the update mode.

11. The system of claim 10, wherein the conversion circuit is configured in the operation mode to convert the drive from the pump driver to the pump and is configured in the update mode to maintain the drive to the pump for the paused pump driver.

12. The system of claim 10, wherein the external TEC driver is configured in the operation mode to drive the TEC device based on the control of the TEC controller and is configured in the update mode to control the TEC device for the paused TEC controller.

13. The system of claim 3, wherein the FPGA is a primary FPGA, the pump driver is a primary pump driver, the TEC controller is a primary TEC controller, and the TEC driver is a primary TEC driver; the system further comprising:
 a backup FPGA disposed in communication with the primary FPGA and including a backup pump driver, a backup TEC controller, and a backup TEC driver.

14. The system of claim 13, wherein each of the primary and secondary pump drivers are configured to drive the pump to produce optical output for the doped fiber amplifier.

15. The system of claim 13, wherein each of the primary and backup TEC controllers are configured to control the TEC device to adjust a temperature of at least a portion of the pump chip.

16. The system of claim 13, wherein:
 the backup FPGA further includes a fast-passive-parallel (FPP) driver; and
 the backup FPGA is coupled to the primary FPGA via the FPP driver.

17. The system of claim 13, wherein the system is configured to:
 pause the primary pump driver in the primary FPGA;
 stop the primary TEC controller in the primary FPGA, and activate the backup TEC controller in the backup FPGA; and
 copy a pump driver value of the primary FPGA to the backup pump driver in the backup FPGA, and activate the backup pump driver in the backup FPGA.

18. The system of claim 17, wherein the system is further configured to:
 store field content of the primary FPGA to a memory;
 reconfigure the primary FPGA;
 restore the field content of the primary FPGA;
 return control on the TEC of the pump chip to the primary FPGA; and
 activate the primary FPGA, and active update of the pump driver value for the pump.

19. The system of claim 13,
 wherein the primary field-programmable gate array (FPGA) has an operation mode and an update mode, the primary pump driver being configured in the operation mode to drive the pump and being at least paused in the update mode, the primary TEC controller being configured in the operation mode to control the TEC device and being at least paused in the update mode; and
 wherein the backup pump driver and the backup TEC controller of the backup FPGA are activated for the primary pump driver and the primary TEC controller of the primary FPGA in the update mode.

* * * * *